(12) United States Patent
Sekitani et al.

(10) Patent No.: US 12,130,320 B2
(45) Date of Patent: Oct. 29, 2024

(54) MEASURING DEVICE

(71) Applicant: Osaka University, Osaka (JP)

(72) Inventors: Tsuyoshi Sekitani, Osaka (JP);
Takafumi Uemura, Osaka (JP);
Shuichi Tsuruta, Osaka (JP)

(73) Assignee: Osaka University, Osaka (JP)

( * ) Notice: Subject to any disclaimer, the term of this patent is extended or adjusted under 35 U.S.C. 154(b) by 34 days.

(21) Appl. No.: 18/000,455

(22) PCT Filed: Jun. 1, 2021

(86) PCT No.: PCT/JP2021/020869
§ 371 (c)(1),
(2) Date: Dec. 1, 2022

(87) PCT Pub. No.: WO2021/246405
PCT Pub. Date: Dec. 9, 2021

(65) Prior Publication Data
US 2023/0213566 A1 Jul. 6, 2023

(30) Foreign Application Priority Data
Jun. 1, 2020 (JP) ................................ 2020-095710

(51) Int. Cl.
*G01R 29/26* (2006.01)
*G01R 15/04* (2006.01)
*G01R 19/10* (2006.01)
*G01R 35/00* (2006.01)

(52) U.S. Cl.
CPC ............ *G01R 29/26* (2013.01); *G01R 15/04* (2013.01); *G01R 19/10* (2013.01); *G01R 35/005* (2013.01)

(58) Field of Classification Search
USPC ........................................................ 324/114
See application file for complete search history.

(56) References Cited

U.S. PATENT DOCUMENTS

2016/0109488 A1* 4/2016 Dearborn .............. H02M 3/158
324/76.11

FOREIGN PATENT DOCUMENTS

JP 2015-135284 7/2015

OTHER PUBLICATIONS

International Search Report issued in International Application No. PCT/JP2021/020869, mailed on Aug. 24, 2021.

* cited by examiner

*Primary Examiner* — Farhana A Hoque
(74) *Attorney, Agent, or Firm* — Knobbe, Martens, Olson & Bear, LLP

(57) ABSTRACT

A measuring device facilitates equipment calibration. A measuring device for measuring noise contained in equipment having a prescribed resistance value is provided with a first voltage-dividing circuit connected to a direct-current power source, a second voltage-dividing circuit connected in parallel with the first voltage-dividing circuit, and a measuring unit which measures a first voltage-divided voltage output from the first voltage-dividing circuit, and a second voltage-divided voltage output from the second voltage-dividing circuit, a calculating unit which calculates the difference between the measured first voltage-divided voltage and second voltage-divided voltage, and an output unit which outputs the calculated result, wherein: the first voltage-dividing circuit outputs the first voltage-divided voltage from the equipment and a first resistor, connected in series.

4 Claims, 4 Drawing Sheets

MEASURING DEVICE

TECHNICAL FIELD

The present invention relates to a measuring device.

BACKGROUND ART

Japan is a developed country facing new problems such as a low birth rate and an aging and declining population. These problems are manifesting in the maintenance of public services such as medical infrastructure. There is a demand for advanced sensors to solve these problems. For example, in recent years there is a demand for highly precise measuring of smaller signals, such as by sensors having a precision that is in the microvolt region rather than the millivolt region, in order to address societal problems such as testing for diseases and nondestructive inspection, etc. As a device for such high-precision measurement, for example, a measuring circuit that measures power supply noise generated in a semiconductor device has been proposed (see Patent Document 1).

Patent Document 1: Japanese Unexamined Patent Application, Publication No. 2015-135284

SUMMARY

Problems to be Solved by the Invention

In equipment where precision is required such as in Patent Document 1, performance and electrical properties of the equipment may undergo changes due to aging deterioration and the usage situation. Because such changes may lead to measurement errors and malfunctioning, there is a demand for an appropriate guarantee of the accuracy of such equipment.

However, in order to guarantee the accuracy of more precise equipment, it is necessary to calibrate the equipment to be adjusted against the Josephson voltage standards (JVSs) to adjust any deviation. Installation space for the Josephson voltage standards (JVSs) is limited, and it is therefore difficult to easily perform calibration and adjustment. The present invention was made in view of this problem, and an object thereof is to provide a measuring device capable of easily performing calibration and adjustment of an equipment.

Means for Solving the Problems

The present invention relates to a measuring device for measuring noise present in equipment having a prescribed resistance value, the measuring device including a first voltage-dividing circuit connectable to a direct-current power supply, a second voltage-dividing circuit connected in parallel with the first voltage-dividing circuit, a measuring unit that measures a first voltage-divided voltage output from the first voltage-dividing circuit and a second voltage-divided voltage output from the second voltage-dividing circuit, a calculating unit that calculates the difference between the measured first voltage-divided voltage and second voltage-divided voltage, and an output unit that outputs the calculated result. The first voltage-dividing circuit is configured to output the first voltage-divided voltage from the equipment and a first resistor, the equipment and the first resistor being connected in series, and the second voltage-dividing circuit is configured to output the second voltage-divided voltage from a second resistor having the same resistance value as the resistance value of the equipment and a third resistor having the same resistance value as the resistance value of the first resistor, the second and third resistors being connected in series.

Preferably, the first voltage-dividing circuit is configured to output the first voltage-divided voltage from the equipment and the first resistor that are connected in series, the equipment comprising a plurality of equipment, and the second voltage-dividing circuit is configured to output the second voltage-divided voltage from a second resistor having the same resistance value as a resistance value of the plurality of equipment, and a third resistor having the same resistance value as the resistance value of the first resistor, the second and third resistors being connected in series.

Preferably, the measuring device further includes an external terminal that is connectable to another equipment and is able to output a prescribed output voltage to the other equipment, a first voltage-generating unit that is connected to the calculating unit and generates a DC voltage of a prescribed value on the basis of an instruction from the calculating unit, and a third voltage-dividing circuit that divides the DC voltage generated by the first voltage-generating unit and outputs a third voltage-divided voltage to the external terminal and the measuring unit. Preferably the measuring unit is configured to measure the third voltage-divided voltage, and the calculating unit is configured to cause the first voltage-generating unit to generate the DC voltage of the prescribed value, on the basis of a prescribed voltage that is to be output to the other equipment, and, is configured to causes the first voltage-generating unit to change the voltage value and output the DC voltage on the basis of a difference between the measured third voltage-divided voltage and the prescribed voltage that is to be output.

Preferably, the measuring device further includes a second voltage-generating unit that generates a DC voltage having a reference value to serve as a reference for adjusting the measuring unit, and a fourth voltage-dividing circuit that divides the voltage generated by the second voltage-generating unit and outputs a fourth voltage-divided voltage. Preferably the calculating unit is configured to correct the measuring unit and change the prescribed value generated by the first voltage-generating unit, on the basis of the measured fourth voltage-divided voltage.

Effects of the Invention

The present invention provides a measuring device that facilitates equipment calibration.

DETAILED DESCRIPTION OF THE PREFERRED EMBODIMENT

A measuring device 1 according to the embodiments of the present invention is described below with reference to FIG. 1 to FIG. 4. First, an overview of the measuring device 1 is described. In the embodiments described below, the term "calibrate" means identifying a deviation (error) from a reference value of a signal output by equipment. Further, the term "adjust" means to remove the deviation identified in the "calibration" so as to match the output signal of the equipment to the reference value. In the embodiments described below, the simple term "equipment" may include either a subject equipment to be measured (not illustrated) or an external equipment (other equipment (not illustrated)) to be adjusted. Further, the term "voltage-divided voltage" means an output voltage that is divided by voltage-dividing resistors.

The measuring device 1 is capable of measuring highly precise values by being calibrated and adjusted by the Josephson voltage standards (JVSs) or a secondary standard with ensured traceability. The measuring device 1 can measure voltage with high precision by, for example, having a measurable voltage adjusted using the Josephson voltage standards (JVSs). For example, the measuring device 1 may be adjusted to be able to measure a DC voltage of 1 mV, and thereby be able to measure a DC voltage of 1 mV with high precision.

In addition, by outputting a signal to serve as an adjustment reference from the equipment, the measuring device 1 may provide external equipment with a signal for adjusting the equipment. For example, by outputting a signal of a 1 mV DC voltage to serve as the adjustment reference, the measuring device 1 may provide a voltage for adjusting the external equipment.

By adjusting the equipment internally by using a signal to serve as the adjustment reference, the measuring device 1 may adjust the precision of the signal output from the equipment. For example, by outputting a signal of a 1 mV DC voltage for adjusting the equipment, the measuring device 1 may adjust the precision of a voltage measuring mechanism in the interior of the measuring device 1. In the embodiments described below, the configuration of the measuring device 1 and the three above operations will be described.

First Embodiment

Figure 1:
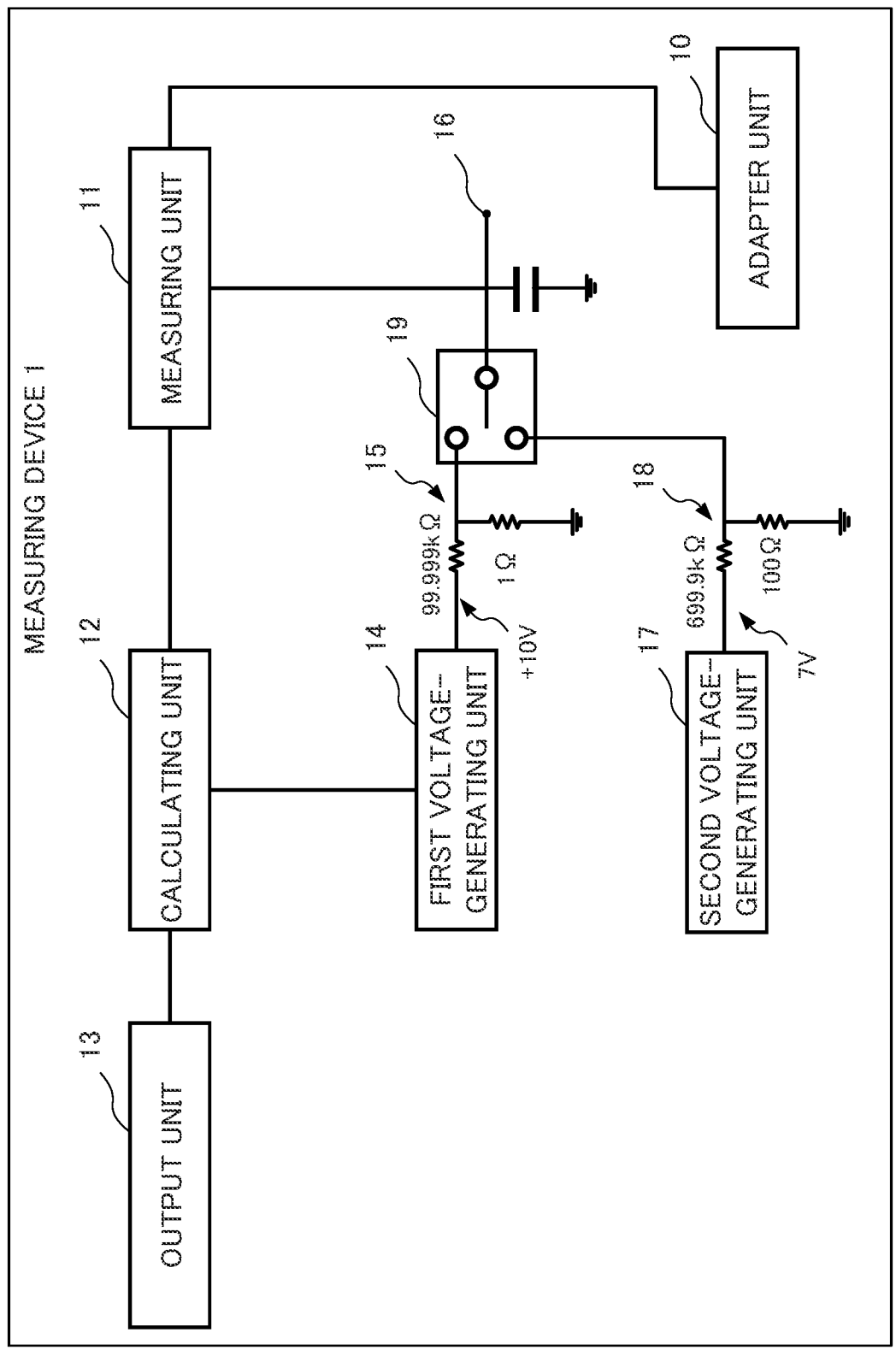
FIG. 1 is a circuit diagram illustrating a circuit structure of a measuring device according to embodiments of the present invention.
Figure 2:
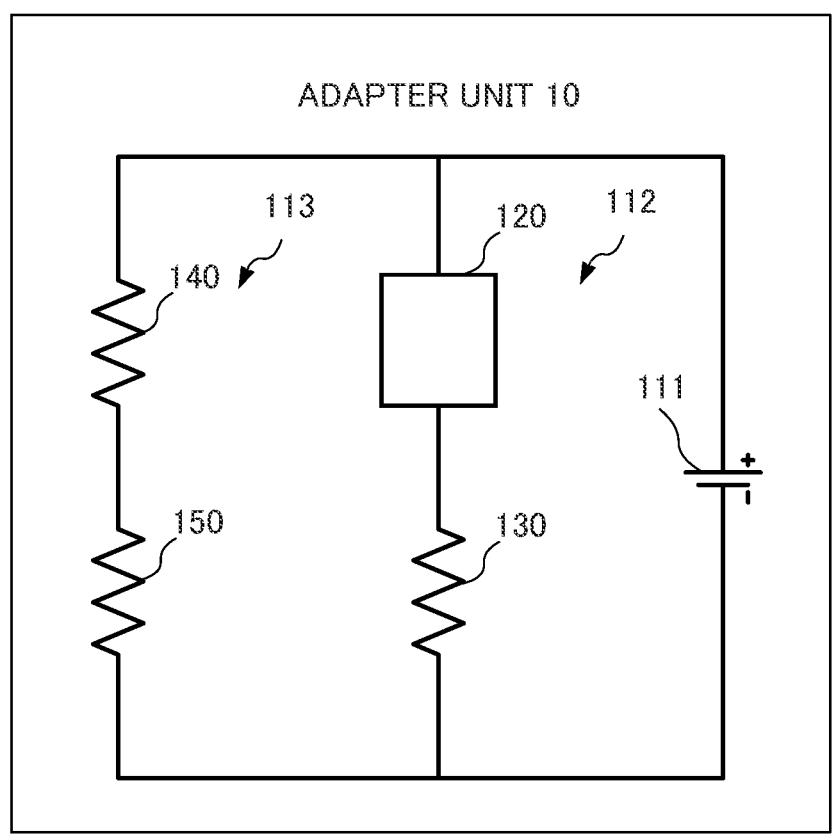
FIG. 2 is a circuit diagram illustrating an adapter unit of a measuring device according to a first embodiment.

To begin with, the configuration of the measuring device 1 according to a first embodiment of the present invention is described with reference to FIG. 1 and FIG. 2. As illustrated in FIG. 1 and FIG. 2, the measuring device 1 measures noise present in equipment having a prescribed resistance value. The measuring device 1 is provided with an adapter unit 10, a measuring unit 11, a calculating unit 12, and an output unit 13.

The adapter unit 10 is, for example, a circuit for measuring noise in equipment to be subject to noise measurement. The adapter unit 10 has a plurality of voltage-dividing circuits connected in parallel. For example, the adapter unit 10 may have eight voltage-dividing circuits (8ch) connected in parallel. In the present embodiment, an example is described wherein two voltage-dividing circuits are provided. As illustrated in FIG. 2, the adapter unit 10 is provided with a direct-current power supply 111, a first voltage-dividing circuit 112, and a second voltage-dividing circuit 113.

The direct-current power supply 111 is, for example, a dry battery. In the present embodiment, the direct-current power supply 111 is configured to be able to supply, for example, a voltage of 3.19 V. The direct-current power supply 111 is connected in series to a bias power supply (not illustrated) that generates a bias voltage.

The first voltage-dividing circuit 112 is connected to the direct-current power supply 111. The first voltage-dividing circuit 112 has a slot 120 to which a subject equipment can be connected, and a first resistor 130 that is connected in series to the slot 120 and has a prescribed resistance value. The first voltage-dividing circuit 112 outputs a first voltage-divided voltage from the subject equipment and the first resistor 130 that are connected in series.

The second voltage-dividing circuit 113 is connected to the direct-current power supply 111. The second voltage-dividing circuit 113 is also connected in parallel with the first voltage-dividing circuit 112. The first voltage-dividing circuit 112 has a second resistor 140 that has the same resistance value as the subject equipment, and a third resistor 150 that is connected in series to the second resistor 140 and has the same resistance value as the resistance value of the first resistor 130. The first voltage-dividing circuit 112 outputs a second voltage-divided voltage from the second resistor 140 that has the same resistance value as the subject equipment and the third resistor 150 that has the same resistance value as the first resistor 130, the second and third resistors being connected in series. The second voltage-dividing circuit 113 is provided so as to measure environmental noise around the adapter unit 10.

The measuring unit 11 is, for example, an analog-to-digital converter. The measuring unit 11 measures the first voltage-divided voltage output from the first voltage-dividing circuit 112 and the second voltage-divided voltage output from the second voltage-dividing circuit 113. The measuring unit 11 is configured to be able to be calibrated and adjusted by, for example, the Josephson voltage standards (JVSs). In other words, the measuring unit 11 is configured such that the voltage measuring precision may be improved by the Josephson voltage standards (JVSs).

The calculating unit 12 is, for example, a CPU. The calculating unit 12 calculates the difference between the measured first voltage-divided voltage and second voltage-divided voltage.

The output unit 13 is, for example, a display device. The output unit 13 outputs the calculated result. For example, by displaying the calculated result, the output unit 13 displays the amount of noise in the subject equipment.

Next, an operation of the measuring device 1 according to the present embodiment is described. First, the measuring unit 11 is adjusted by the Josephson voltage standards (JVSs) or the like. For example, the measuring unit 11 is adjusted by the Josephson voltage standards (JVSs) at prescribed intervals. Next, the subject equipment is connected to the slot 120.

Next, electric power is supplied from the direct-current power supply 111, whereby the first voltage-divided voltage and the second voltage-divided voltage are output. The measuring unit 11 measures each of the first voltage-divided voltage and the second voltage-divided voltage.

Next, the calculating unit 12 calculates the difference between the measured first voltage-divided voltage and second voltage-divided voltage. In other words, the calculating unit 12 calculates noise present in the subject equipment by subtracting the environmental noise voltage from the voltage applied to and output from the subject equipment. Next, the output unit 13 outputs the calculated value as the noise of the subject equipment.

The measuring device 1 according to the first embodiment described above exhibits the following effects.

(1) A measuring device 1 for measuring noise present in equipment having a prescribed resistance value, the measuring device 1 including a first voltage-dividing circuit 112 connectable to a direct-current power supply 111, a second voltage-dividing circuit 113 connected in parallel with the first voltage-dividing circuit 112, a measuring unit 11 that measures a first voltage-divided voltage output from the first voltage-dividing circuit 112 and a second voltage-divided voltage output from the second voltage-dividing circuit 113, a calculating unit 12 that calculates the difference between the measured first voltage-divided voltage and second voltage-divided voltage, and an output unit 13 that outputs the calculated result. The first voltage-dividing circuit 112 outputs the first voltage-divided voltage from the equipment and a first resistor 130 that are connected in series, and the second voltage-dividing circuit 113 outputs the second voltage-divided voltage from a second resistor 140 having the same resistance value as the resistance value of the equipment and a third resistor 150 having the same resistance value as the resistance value of the first resistor 130, which are connected in series. This allows the measuring device to easily measure the noise of the subject equipment with high precision, while taking the surrounding environmental noise into account.

Second Embodiment

Figure 4:
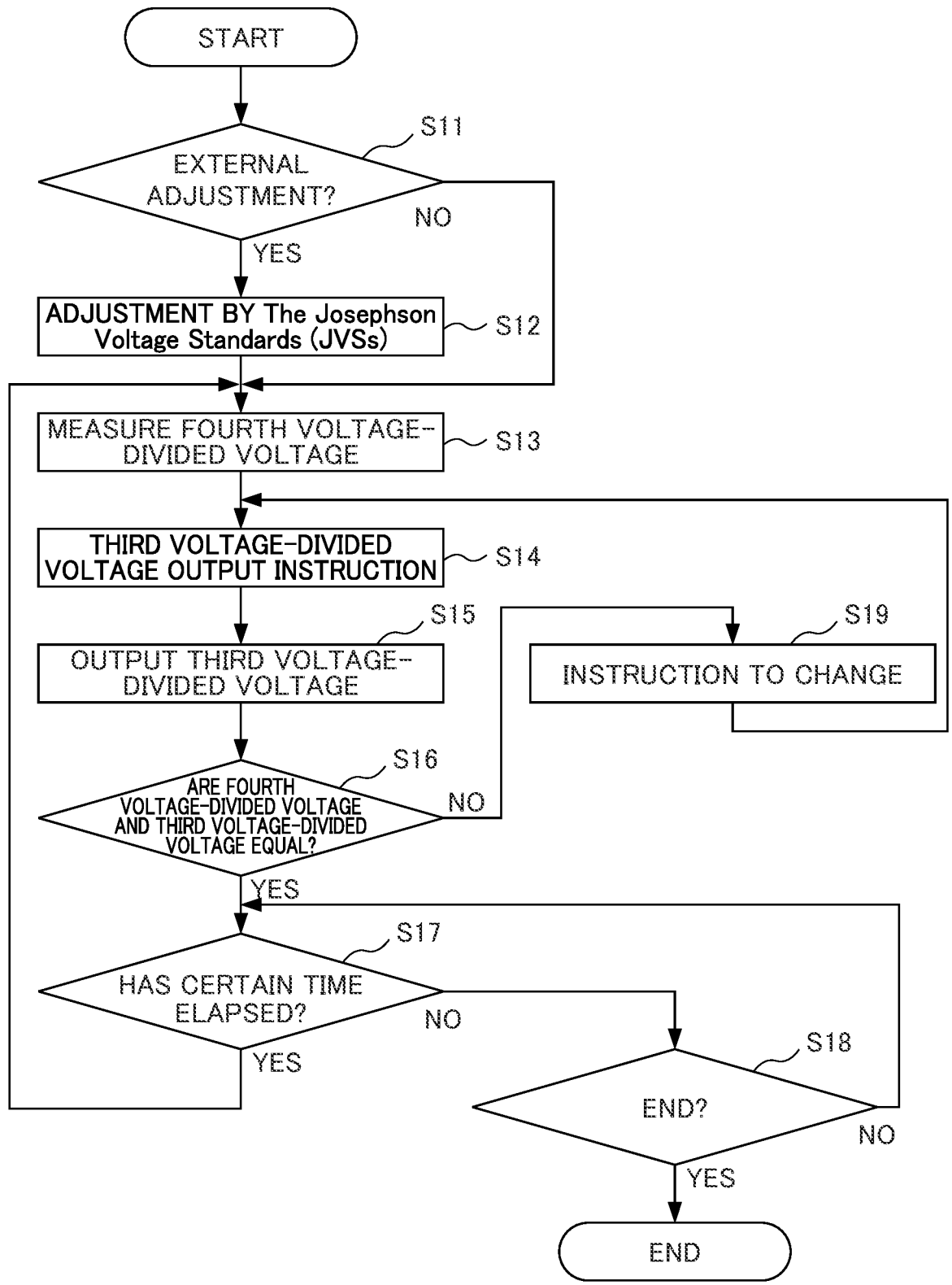
FIG. 4 is a flowchart illustrating a flow of adjusting a measuring device according to a third embodiment itself.

Next, the measuring device 1 according to a second embodiment of the present invention is described with reference to FIG. 1 and FIG. 4. In the description of the second embodiment, constituent elements that are identical to those of the previously described embodiment are given the same reference numerals, and description thereof is omitted or simplified. The measuring device 1 according to the second embodiment outputs a signal to serve as a reference for other equipment. That is to say, the measuring device 1 according to the second embodiment operates as a standard for other equipment.

As illustrated in FIG. 1, the measuring device 1 according to the second embodiment is further provided with an external terminal 16, a first voltage-generating unit 14, a third voltage-dividing circuit 15, and thus differs from the first embodiment. The measuring device 1 according to the second embodiment also differs from the first embodiment in that the calculating unit 12 is able to instruct the first voltage-generating unit 14 described below to generate a voltage. The measuring device 1 according to the second embodiment also differs from the first embodiment in that the measuring unit 11 measures a third voltage-divided voltage output from the third voltage-dividing circuit 15 described below.

The external terminal 16 is, for example, a terminal that is connected to another equipment (external equipment) and is able to output a prescribed output voltage to the other equipment. In the present embodiment, the external terminal 16 is a terminal that is able to output, for example, a DC voltage of 1 mV to the external equipment.

The first voltage-generating unit 14 is, for example, a digital-to-analog converter. The first voltage-generating unit 14 is connected to the calculating unit 12, and generates a DC voltage of a prescribed value on the basis of an instruction from the calculating unit 12. The first voltage-generating unit 14 can, for example, vary a voltage from −10 V to +10 V at a resolution of 220 bits and output the voltage. In the present embodiment, as an example, the first voltage-generating unit 14 generates a DC voltage of +10 V.

The third voltage-dividing circuit 15 divides the DC voltage generated by the first voltage-generating unit 14 and outputs a third voltage-divided voltage to the external terminal 16 and the measuring unit 11. The third voltage-dividing circuit 15 outputs the third voltage-divided voltage from, for example, a 99.999 kΩ resistor and a 1Ω resistor that are connected in series. In other words, in the present embodiment, the third voltage-dividing circuit 15 outputs a signal having a DC voltage of −1 mV to +1 mV.

Figure 3:
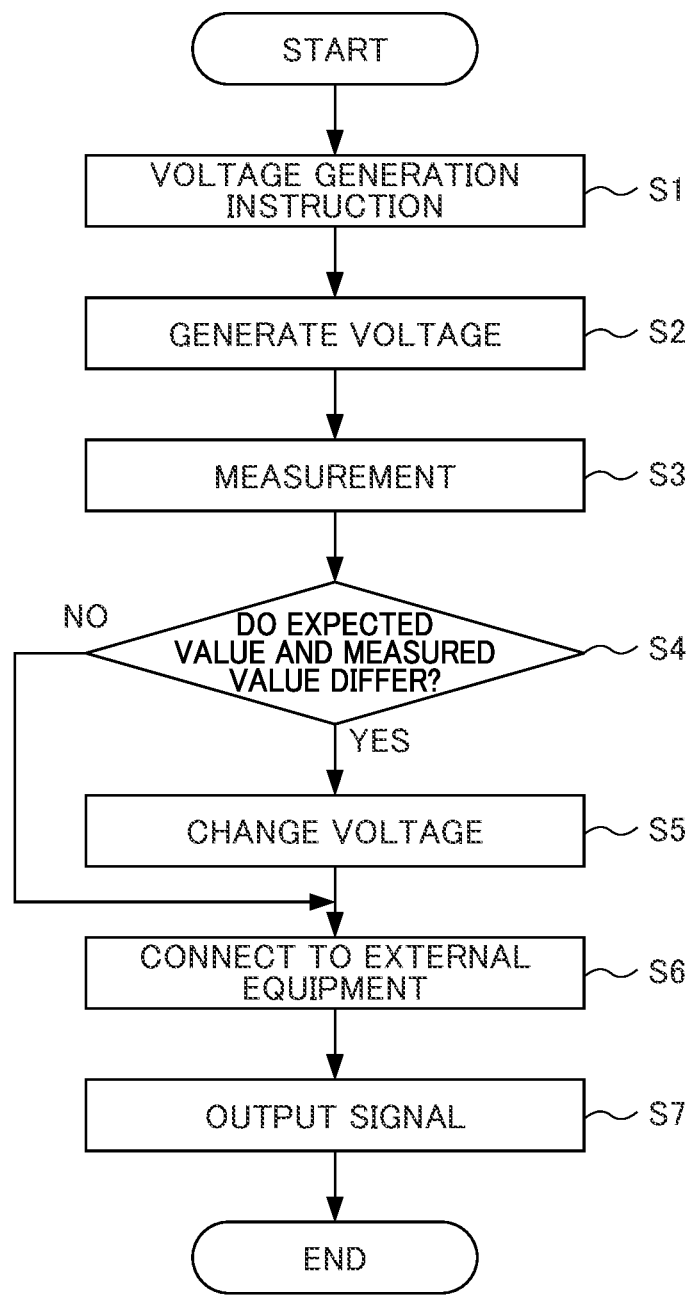
FIG. 3 is a flowchart illustrating a flow of transmitting a signal for adjusting an external device using a measuring device according to a second embodiment.

Next, an operation of the measuring device 1 according to the present embodiment is described with reference to the flowchart in FIG. 3. First, the calculating unit 12, on the basis of a prescribed voltage that is to be output to another equipment, causes the first voltage-generating unit 14 to generate a DC voltage of a prescribed value (Step S1). In the present embodiment, when generating, for example, a DC voltage of 0.5 mV for the other equipment, the calculating unit 12 instructs the first voltage-generating unit 14 to generate a voltage of 5 V.

Next, the first voltage-generating unit 14 generates the instructed voltage (Step S2). Next, the measuring unit 11 measures the third voltage-divided voltage output from the third voltage-dividing circuit 15 (Step S3).

Next, at Step S4, the calculating unit 12 determines whether or not an expected voltage value (expected value) and the measured voltage value (measured value) differ. If the expected value and the measured value differ (Step S4: YES), the process proceeds to Step S5. However, if the expected value and the measured value are the same (Step S4: NO), the process proceeds to Step S6.

At Step S5, the calculating unit 12 instructs the first voltage-generating unit 14 to generate a voltage that is changed from the voltage of the prescribed value (Step S5). For example, the calculating unit 12 causes the first voltage-generating unit 14 to change the voltage value and output a DC voltage on the basis of the difference between the third voltage-divided voltage and the prescribed voltage that is to be output.

At Step S6, the external terminal 16 is connected to the other equipment. Next, the calculating unit 12 causes the first voltage-generating unit to generate the voltage that is to be output. Thus, a voltage (reference voltage) is output to serve as a reference for the other equipment.

The measuring device 1 according to the second embodiment exhibits the following effects.
(2) The measuring device 1 includes an external terminal 16 that is connectable to another equipment and is able to output a prescribed output voltage to the other equipment, a first voltage-generating unit 14 that is connected to the calculating unit 12 and generates a DC voltage of a prescribed value on the basis of an instruction from the calculating unit 12, and a third voltage-dividing circuit 15 that divides the DC voltage generated by the first voltage-generating unit 14 and outputs a third voltage-divided voltage to the external terminal 16 and the measuring unit 11, wherein the measuring unit 11 measures the third voltage-divided voltage, and the calculating unit 12, on the basis of a prescribed voltage that is to be output to the other equipment, causes the first voltage-generating unit 14 to generate the DC voltage of the prescribed value, and, on the basis of a difference between the measured third voltage-divided voltage and the prescribed voltage that is to be output, causes the first voltage-generating unit 14 to change the voltage value and output the DC voltage. This makes it possible to provide the other equipment with a voltage to serve as a reference for adjusting the other equipment. This allows for easy calibration and adjustment of the other equipment, with high precision.

Third Embodiment

Next, a third embodiment of the present invention is described with reference to FIG. 1 and FIG. 4. In the description of the third embodiment, constituent elements that are identical to those of the previously described embodiments are given the same reference numerals, and description thereof is omitted or simplified. By correcting the measuring unit 11 (or the third voltage-dividing circuit 15), the measuring device 1 according to the third embodiment is able to internally adjust the measuring precision of the reference voltage. The measuring device 1 according to the third embodiment is a device that is able to adjust the measuring unit 11 and the voltage generated by the first voltage-generating unit 14, while taking into account, for example, changes in the resistance value affected by the surrounding temperature, etc. The measuring device 1 according to the third embodiment is also able to perform adjustments after adjustment by the Josephson voltage standards (JVSs) without using the Josephson voltage standards (JVSs).

The measuring device 1 according to the third embodiment is further provided with a second voltage-generating unit 17, a fourth voltage-dividing circuit 18, and a switching unit 19, and thus differs from the first and second embodiments. The measuring device 1 according to the third embodiment also differs from the second embodiment in that the calculating unit 12, on the basis of a fourth voltage-divided voltage output by the fourth voltage-dividing circuit 18 described below, changes the prescribed value of the voltage generated by the first voltage-generating unit 14.

The second voltage-generating unit 17 is, for example, a reference voltage IC or the like having a small temperature coefficient and experiencing little deterioration over time. The second voltage-generating unit 17 generates a DC voltage having a reference value to serve as a reference for adjusting the measuring unit 11. In contrast to the first voltage-generating unit 14 that is able to generate a plurality of voltages, the second voltage-generating unit 17 generates only a single voltage. In the present embodiment, the second voltage-generating unit 17 generates a DC voltage of 7 V.

The fourth voltage-dividing circuit 18 divides the DC voltage generated by the first voltage-generating unit 14 and outputs a fourth voltage-divided voltage to the external terminal 16 and the measuring unit 11. The fourth voltage-dividing circuit 18 is, for example, a resistor having better thermal performance and experiencing less aging error compared with the third voltage-dividing circuit 15. The fourth voltage-dividing circuit 18 outputs the fourth voltage-divided voltage from, for example, a 699.9 kΩ resistor and a 100Ω resistor that are connected in series. In other words, in the present embodiment, the fourth voltage-dividing circuit 18 outputs a signal having a DC voltage of 1 mV.

The switching unit 19 is a member that is able to switch the input to the measuring unit 11 and the external terminal 16 between the third voltage-divided voltage and the fourth voltage-divided voltage. The switching unit 19 is configured to be able to switch the input by, for example, being controlled by the calculating unit 12. When outputting a signal to another equipment, for example, the switching unit 19 switches the input source to the third voltage-divided voltage, on the basis of control by the calculating unit 12. Meanwhile, when adjusting the measuring unit 11, for example, the switching unit 19 switches the input source to the fourth voltage-divided voltage, on the basis of control by the calculating unit 12.

Next, an operation of the measuring device 1 according to the third embodiment is described with reference to FIG. 4. First, it is determined whether or not adjustment is to be performed using the external Josephson voltage standards (JVSs) (Step S11). For example, before use of the measuring device 1, the initial adjustment is performed using the external Josephson voltage standards (JVSs). When performing an adjustment using the external Josephson voltage standards (JVSs) (Step S11: YES), the process proceeds to Step S12. However, when not performing the adjustment using the external Josephson voltage standards (JVSs) (Step S11: NO), the process proceeds to Step S13.

At Step S12, the measuring device is adjusted by the external Josephson voltage standards (JVSs) or the like. Specifically, the measuring unit 11 measures a national standard voltage (for example, 1 mV) that serves as a reference input from the external Josephson voltage standards (JVSs). Thus, the measuring unit 11 is calibrated and adjusted so as to be able to measure the national standard voltage. The process then proceeds to Step S13.

At Step S13, the measuring unit 11 measures the fourth voltage-divided voltage. Specifically, the calculating unit 12 switches the input to the switching unit 19 to the fourth voltage-divided voltage. Then, the measuring unit 11 measures the fourth voltage-divided voltage. The calculating unit 12 corrects the difference between the measured value and the theoretical value of the fourth voltage-divided voltage. Next, the calculating unit 12 instructs the first voltage-generating unit 14 to output the third voltage-divided voltage so as to have the same voltage value as the fourth voltage-divided voltage (Step S14). At this time, the calculating unit 12 changes the input to the switching unit 19 to the third voltage-divided voltage.

Next, the third voltage-dividing circuit 15 outputs the third voltage-divided voltage (Step S15). The measuring unit 11 measures the third voltage-divided voltage.

Next, the calculating unit 12 compares the measured third voltage-divided voltage and fourth voltage-divided voltage (Step S16). If the third voltage-divided voltage and the fourth voltage-divided voltage are the same (Step S16: YES), the process proceeds to Step S17. However, if the third voltage-divided voltage and the fourth voltage-divided voltage differ (Step S16: NO), the process proceeds to Step S19.

At Step S17, adjustment of the first voltage-generating unit 14 responsive to the third voltage-dividing circuit 15 finishes. Then, after a certain time has elapsed (for, example, one hour later), adjustment is performed again. If the certain time has elapsed (Step S17: YES), the process returns to Step S13. However, if the certain time has not elapsed (Step S17: NO), the process proceeds to Step S18.

At Step S18, it is determined whether or not the measuring equipment has stopped. If the measuring equipment has stopped (Step S18: YES), the process according to the present flowchart ends. However, if operation of the measuring equipment continues (Step S18: NO), the process returns to Step S17.

At Step S19, the calculating unit 12, on the basis of the difference between the third voltage-divided voltage and the fourth voltage-divided voltage, instructs the first voltage-generating unit to generate a changed voltage value. Then, the process returns to Step S14.

The measuring device 1 according to the third embodiment exhibits the following effects.

(3) The measuring device 1 includes a second voltage-generating unit 17 that generates a DC voltage having a reference value to serve as a reference for adjusting the measuring unit 11, and a fourth voltage-dividing circuit 18 that divides the voltage generated by the second voltage-generating unit 17 and outputs a fourth voltage-divided voltage, wherein the calculating unit 12, on the basis of the measured fourth voltage-divided voltage, changes the prescribed value generated by the first voltage-generating unit 14. This allows for outputting of a precise reference voltage to the exterior, regardless of changes in the environment such as the surrounding temperature, etc.

Preferred embodiments of the measuring device according to the present invention are described above, but the present invention is not limited to these embodiments, and may be modified as appropriate. For example, in the above embodiments, the first, second, and third embodiments may be configured as separate devices. For example, the measuring unit 11, the calculating unit 12, the first voltage-generating unit 14, the third voltage-dividing circuit 15, and the external terminal 16 may be used to configure only the measuring device 1 according to the second embodiment.

Further, in the first embodiment, the first voltage-dividing circuit 112 may output the first voltage-divided voltage from a plurality of equipment and the first resistor 130, which are connected in series. Further, the second voltage-dividing circuit 113 may output the second voltage-divided voltage from the second resistor 140 that has the same resistance value as a plurality of equipment and the third resistor 150 that has the same resistance value as the resistance value of the first resistor 130, the equipment and the second and third resistors being connected in series. This allows for the presence of noise in a plurality of equipment to be measured at once, which improves measuring efficiency.

Further, in the above embodiments, the calculating unit 12 may be configured to transmit, to an external server (not illustrated), a log of the temperature in the interior and the exterior of the measuring device, a log of corrections of the measuring unit 11 and the first voltage-generating unit 14, and information on subject equipment that has been determined to be abnormal. Further, a configuration is possible wherein such information, obtained from a plurality of measuring devices 1, is statistically analyzed in the external server. This allows for the discovery of abnormal measuring devices 1, and wireless calibration and adjustment that do not require a physical electrical connection to the Josephson voltage standards (JVSs) or the like, in the external server.

EXPLANATION OF REFERENCE NUMERALS

1 Measuring device
11 Measuring unit
12 Calculating unit
13 Output unit
14 First voltage-generating unit
15 Third voltage-dividing circuit
16 External terminal
17 Second voltage-generating unit
18 Fourth voltage-dividing circuit
111 Direct-current power supply
112 First voltage-dividing circuit
113 Second voltage-dividing circuit
130 First resistor
140 Second resistor
150 Third resistor

What is claimed is:

1. A measuring device for measuring noise present in equipment having a prescribed resistance value, the measuring device comprising:
    a first voltage-dividing circuit connectable to a direct-current power supply;
    a second voltage-dividing circuit connected in parallel with the first voltage-dividing circuit;
    a measuring unit that measures a first voltage-divided voltage output from the first voltage-dividing circuit and a second voltage-divided voltage output from the second voltage-dividing circuit;
    a calculating unit that calculates a difference between the measured first voltage-divided voltage and second voltage-divided voltage; and
    an output unit that outputs a calculated result,
    wherein
    the first voltage-dividing circuit is configured to output the first voltage-divided voltage from the equipment and a first resistor, the equipment and the first resistor being connected in series, and
    the second voltage-dividing circuit is configured to output the second voltage-divided voltage from a second resistor having a same resistance value as a resistance value of the equipment, and a third resistor having a same resistance value as a resistance value of the first resistor, the second and third resistors being connected in series.

2. The measuring device according to claim 1, wherein
    the first voltage-dividing circuit is configured to output the first voltage-divided voltage from the equipment and the first resistor that are connected in series, the equipment comprising a plurality of equipment, and
    the second voltage-dividing circuit is configured to output the second voltage-divided voltage from a second resistor having the same resistance value as a resistance value of the plurality of equipment, and a third resistor having the same resistance value as the resistance value of the first resistor, the second and third resistors being connected in series.

3. The measuring device according to claim 1, further comprising:
    an external terminal that is connectable to another equipment and is able to output a prescribed output voltage to the other equipment;
    a first voltage-generating unit that is connected to the calculating unit and generates a DC voltage of a prescribed value on the basis of an instruction from the calculating unit; and
    a third voltage-dividing circuit that divides the DC voltage generated by the first voltage-generating unit and outputs a third voltage-divided voltage to the external terminal and the measuring unit,
    wherein
    the measuring unit is configured to measure the third voltage-divided voltage, and
    the calculating unit is configured to cause the first voltage-generating unit to generate the DC voltage of the prescribed value, on the basis of a prescribed voltage that is to be output to the other equipment, and is configured to cause the first voltage-generating unit to change the voltage value and output the DC voltage, on the basis of a difference between the measured third voltage-divided voltage and the prescribed voltage that is to be output.

4. The measuring device according to claim 3, further comprising:
- a second voltage-generating unit that generates a DC voltage having a reference value to serve as a reference for adjusting the measuring unit; and
- a fourth voltage-dividing circuit that divides the voltage generated by the second voltage-generating unit and outputs a fourth voltage-divided voltage, wherein the calculating unit is configured to correct the measuring unit and change the prescribed value generated by the first voltage-generating unit, on the basis of the measured fourth voltage-divided voltage.

\* \* \* \* \*